(12) United States Patent
Lamy (10) Patent No.: US 7,222,283 B2
(45) Date of Patent: May 22, 2007

(54) METHOD AND DEVICE FOR BUILDING A VARIABLE-LENGTH ERROR CODE

(75) Inventor: Catherine Lamy, Paris (FR)

(73) Assignee: Koninklijke Philips Electronics N. V., Eindhoven (NL)

( * ) Notice: Subject to any disclaimer, the term of this patent is extended or adjusted under 35 U.S.C. 154(b) by 41 days.

(21) Appl. No.: 10/531,969

(22) PCT Filed: Oct. 14, 2003

(86) PCT No.: PCT/IB03/04520

§ 371 (c)(1),
(2), (4) Date: Apr. 20, 2005

(87) PCT Pub. No.: WO2004/038926

PCT Pub. Date: May 6, 2004

(65) Prior Publication Data

US 2006/0015796 A1    Jan. 19, 2006

(30) Foreign Application Priority Data

Oct. 23, 2002  (EP) ................... 02292624

(51) Int. Cl.
*H03M 13/00*  (2006.01)

(52) U.S. Cl. ....................... 714/752

(58) Field of Classification Search ............... 714/752
See application file for complete search history.

(56) References Cited

OTHER PUBLICATIONS

"Variable-Length Error-Correcting Codes", Victor Buttigieg, 1995, Dept. of Electrical Engineering. pp. 1-248.

*Primary Examiner*—Guy Lamarre
*Assistant Examiner*—Sam Rizk (57) ABSTRACT

The invention relates to a variable-length error-correcting (VLEC) code technique, in which the main steps are: defining all the needed parameters, generating a code having a fixed length L1, storing in a set W thus obtained all the possible L1-tuples distant of the minimum diverging distance d[min] from the codewords (one extra-bit being affixed at the end of all words if the new set W thus obtained is not empty), deleting all words of W that do not satisfy a distance criterion with all codewords, and verifying that all words of the final set W satisfy another distance criterion. Assuming that most good codes do not have jump of length, the method according to the invention allows to reduce the set of examined VLEC codes. Following this hypothesis, a new construction method, called no hole optimization, is defined, in which it is avoided to add more than one bit at the end of each word of the set W. The new algorithm does not consider very unlikely code structures and thus allows to gain in complexity.

2 Claims, 11 Drawing Sheets

| dfree | AL | TIME | CODE STRUCTURE |
|---|---|---|---|
| 3 | 6,4;4,6 | 4s | (1@4,-; 1@5,-; 1@6,3; 8@7,3; 4@8,3; 3@9,3; 1@10,-; 2@11,4; 1@12,-; 1@13,-; 1@14,-; 2,1) |
| 5 | 8,5;0,6,1 | 15s | (1@6,-; 2@7,5; 3@8,5; 4@9,5; 4@10,5; 5@11,5; 5@12,5; 2@13,5; 3,2) |
| 7 | 10,7;9 | 2min | (1@8,-; 2@9,7; 2@10,7; 3@11,7; 4@12,7; 4@13,7; 6@14,7; 4@15,7; 4,3) |

FIG. 6 (PRIOR ART)

| $d_{free}$ | AL | TIME | CODE STRUCTURE |
|---|---|---|---|
| 3 | 6,3038 | 50 s | (1@4,-; 2@5,4; 4@6,3; 4@7,3; 6@8,3; 5@9,3; 2@10,4; 2@11,3; 2,1) |
| 5 | 8,1752 | 16 min | (1@6,-; 1@7,-; 4@8,5; 5@9,5; 5@10,5; 5@11,5; 5@12,5; 3,2) |
| 7 | 10,7385 | 14 h | (1@7,-; 1@8,-; 1@9,-; 1@10,-; 3@11,7; 4@12,7; 5@13,7; 5@14,7; 5@15,7; 4,3) |

FIG. 8 (PRIOR ART)

| SOURCE SYMBOL | PROBABILITY |
|---|---|
| e | 0,1270 |
| t | 0,0906 |
| a | 0,0817 |
| o | 0,0751 |
| i | 0,0697 |
| n | 0,0674 |
| s | 0,0633 |
| h | 0,0609 |
| r | 0,0599 |
| d | 0,0425 |
| l | 0,0403 |
| c | 0,0278 |
| u | 0,0276 |
| m | 0,0241 |
| w | 0,0236 |
| f | 0,0223 |
| g | 0,0202 |
| y | 0,0197 |
| p | 0,0193 |
| b | 0,0149 |
| v | 0,0098 |
| k | 0,0077 |
| j | 0,0015 |
| x | 0,0015 |
| q | 0,0010 |
| z | 0,0007 |

| dfree | AL | TIME | CODE STRUCTURE |
|---|---|---|---|
| 3 | 6,3494 | 42s | (1@4,-;1@5,-;5@6,3;6@7,3;4@8,3;4@9,3;1@10,-;1@12,-;2@13,-;1@14,-;2,1) |
| 5 | 8,5061 | 3min | (1@6,-;2@7,5;3@8,5;4@9,5;4@10,5;5@11,5;5@12,5;2@13,5;3,2) |
| 7 | 10,79 | 13min | (1@8,-;2@9,7;2@10,7;3@11,7;4@12,7;4@13,7;6@14,7;4@15,7;4,3) |

FIG.12

| dfree | AL | TIME | CODE STRUCTURE |
|---|---|---|---|
| 3 | 6,3530 | 17s | (1@4,-;1@5,-;5@6,3;6@7,3;4@8,3;3@9,3;2@10,4;2@11,3;1@12,-;1@13,-;2,1) |
| 5 | 8,5061 | 45s | (1@6,-;2@7,5;3@8,5;4@9,5;4@10,5;5@11,5;5@12,5;2@13,5;3,2) |
| 7 | 10,79 | 3min | (1@8,-;2@9,7;2@10,7;3@11,7;4@12,7;4@13,7;6@14,7;4@15,7;4,3) |

FIG.13

METHOD AND DEVICE FOR BUILDING A VARIABLE-LENGTH ERROR CODE

FIELD OF THE INVENTION

The present invention relates to a method of building a variable length error code, said method comprising the steps of:

(1) initializing the needed parameters: minimum and maximum length of codewords $L_1$ and $L_{max}$ respectively, free distance $d_{free}$ between each codeword (said distance $d_{free}$ being for a VLEC code C the minimum Hamming distance in the set of all arbitrary extended codes), required number of codewords S;

(2) generating a fixed length code C of length $L_1$ and minimal distance $b_{min}$, with $b_{min}=\min \{b_k; k=1, 2, \ldots, R\}$, $b_k$=the distance associated to the codeword length $L_k$ of code C and defined as the minimum Hamming distance between all codewords of C with length $L_k$, and R=the number of different codeword lengths in C, said generating step creating a set W of n-bit long words distant of d;

(3) listing and storing in the set W all the possible $L_1$-tuples at the distance of $d_{min}$ from the codewords of C (said distance $d_{min}$ for a VLEC code C being the minimum value of all the diverging distances between all possible couples of different-length codewords of C), and, if said set W is not empty, doubling the number of words in W by affixing at the end of all words one extra bit, said storing step therefore replacing the set W by a new one having twice more words than the previous one and the length of each one of these words being $L_1+1$;

(4) deleting all the words of the set W that do not satisfy the $c_{min}$ distance with all codewords of C, said distance $c_{min}$ being the minimum converging distance of the code C;

(5) in the case where no word is found or the maximum number of bits is reached, reducing the constraint of distance for finding more words;

(6) controlling that all words of the set W are distant of $b_{min}$, the found words being then added to the code C;

(7) if the required number of codewords has not been reached, repeating the steps (1) to (6) until the method finds either no further possibility to continue or the required number of codewords;

(8) if the number of codewords of C is greater than S, calculating on the basis of the structure of the VLEC code, the average length AL obtained by weighting each codeword length with the probability of the source, said AL becoming the $AL_{min}$, if it is lower than $AL_{min}$, with $AL_{min}$=the minimum value of AL, and the corresponding code structure being kept in memory.

BACKGROUND OF THE INVENTION

Figure 1:
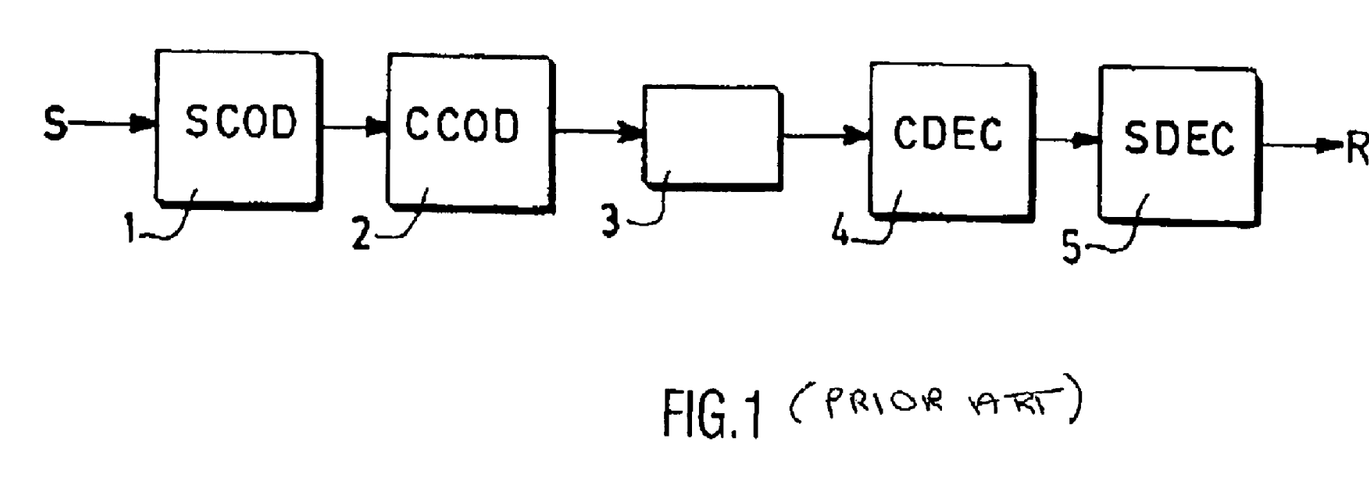
FIG. 1 depicts a conventional communication channel.

A classical communication chain, illustrated in FIG. 1, comprises, for coding the signals coming from a source S, a source coder 1 (SCOD) followed by a channel coder 2 (CCOD) and, after the transmission of the coded signals thus obtained through a channel 3, a channel decoder 4 (CDEC) and a source decoder 5 (SDEC). The decoded signals are intended to be sent towards a receiver. Variable-length codes (VLC) are classically used in source coding for their compression capabilities, and the associated channel coding techniques combat the effects of the real transmission channel (such as fading, noise, etc.). However, since source coding is intended to remove redundancy and channel coding to re-introduce it, it has been investigated how to efficiently coordinate these techniques in order to improve the overall system while keeping the complexity at an acceptable level.

Among the solutions proposed in such an approach, the variable-length error correcting (VLEC) codes present the advantage to be variable-length while providing error correction capabilities, but building these codes is rather time consuming for short alphabets (and become even prohibitive for higher length alphabets sources), and the construction complexity is also a drawback, as it will be seen.

First, some definitions and properties of the classical VLC must be recalled. A code C is a set of S codewords $\{c_1, c_2, c_3, \ldots, c_i, \ldots c_S\}$, for each of which a length $l_i=|c_i|$ is defined, with $l_1 \leq l_2 \leq l_3' \ldots \leq l_i \leq \ldots \leq l_S$ without any loss of generality. The number of different codeword lengths in the code C is called R, with obviously $R \leq S$, and these lengths are denoted as $L_1, L_2, L_3, \ldots, L_i, \ldots L_R$, with $L_1 < L_2 < L_3 < \ldots < L_R$. A variable-length code, or VLC, is then the structure denoted by $(s_1@L_1, s_2@L_2, s_3@L_3, \ldots, s_R@L_R)$, which corresponds to $s_1$ codewords of length $L_1$, $s_2$ codewords of length $L_2$, $s_3$ codewords of length $L_3$, ..., and $s_R$ codewords of length $L_R$. When using a VLC, the compression efficiency, for a given source, is related to the number of bits necessary to transmit symbols from said source. The measure used to estimate this efficiency is often the average length AL of the code (i.e. the average number of bits needed to transmit a word), said average length being given, when each symbol $a_i$ is mapped to the codeword $c_i$, by the following relation (1):

$$AL = \sum_{i=1}^{i=s} l_i \cdot P(a_i) \quad (1)$$

which is equivalent to the relation (2):

$$AL = \sum_{i=1}^{R} L_i \cdot \left( \sum_{j=r(i)+1}^{j=r(i+1)} P(a_j) \right) \quad (2)$$

where, for a data source A, the S source symbols are denoted by $\{a_1, a_2, a_3, \ldots, a_s\}$ and $P(a_i)$ is the respective probability of occurrence of each of these symbols, with $\Sigma P(a_i)=1$ (from i=1 to i=S). If $AL_{min}$ denotes the minimal value for the average length AL, it is easy to see that when $AL_{min}$ is reached, the symbols are indexed in such a way that $P(a_1) \geq P(a_2) \geq P(a_3) \geq \ldots \geq P(a_i) \geq \ldots P(a_s)$. In order to encode the data in such a way that the receiver can decode the coded information, the VLC must satisfy the following properties: to be non-singular (all the codewords are distinct, i.e. no more than one source symbol is allocated to one codeword) and to be uniquely decodable (i.e. it is possible to map any string of codewords unambiguously back to the correct source symbols, without any error).

An introduction and a presentation of different distances that are useful when reviewing some general properties of the VLC codes will then help to recall the notion of error-correcting property used in the VLEC code theory:

(a) Hamming weight and distance: if w is a word of length n with $w=(w_1, w_2, \ldots, w_n)$, the Hamming weight of w, or simply weight, is the number W(w) of non-zero symbols in w:

$$W(w) = \sum_{i=1}^{i=n} \frac{w_i}{\|w_i\|} \quad (3)$$

and, if $w_1$ and $w_2$ are two words of equal length n with $w_i=(w_{i1}, w_{i2}, w_{i3}, \ldots, w_{in})$ and i=1 or 2, the Hamming distance (or, simply, distance) between $w_1$ and $w_2$ is the number of positions in which $w_1$ and $w_2$ differ (for example, for the binary case, it is easy to see that:

$$H(w_1, w_2) = W(w_1 + w_2) \qquad (4)$$

where the addition is modulo-2). However, the Hamming distance is by definition restricted to fixed-length codes, and other definitions will be defined before considering VLEC codes.

(b) let $f_i = w_1^i w_2^i, \ldots w_n^i$ be a concatenation of n words of a VLEC code C, then the set $F_N = \{f_i : |f_i| = N\}$ is called the extended code of C of order N.

(c) minimum block distance and overall minimum block distance: the minimum block distance $b_k$ associated to the codeword length $L_k$ of a VLEC code C is defined as the minimum Hamming distance between all distinct codewords of C with the same length $L_k$:

$$b_k = \min \{H(c_i, c_j): c_i, c_j \in C, i \neq j, |c_i| = |c_j| = L_k\} \text{ for } k = 1, \ldots, R \qquad (5)$$

and the overall minimum block distance $b_{min}$ of said VLEC code C, which is the minimum block distance value for every possible length $L_k$, is defined by:

$$b_{min} = \min\{b_k: k = 1, \ldots R\} \qquad (6)$$

(d) diverging distance and minimum diverging distance: the diverging distance between two codewords of different length $$c_i = x_{i_1} x_{i_2} \ldots x_{i_{l_i}} \text{ and } c_j = x_{j_1} x_{j_2} \ldots x_{j_{l_j}}$$

of a VLEC code C, where $c_i, c_j \in C$, $l_i = |c_i|$ and $l_j = |c_j|$ with $l_i > l_j$, is defined by:

$$D(c_i, c_j) = H\left(x_{i_1} x_{i_2} \ldots x_{i_{l_j}}, x_{j_1} x_{j_2} \ldots x_{j_{l_j}}\right) \qquad (7)$$

i.e. it is also the Hamming distance between a $l_j$-length codeword and the $l_j$-length prefix of a longer codeword, and the minimum diverging distance $d_{min}$ of said VLEC code C is the minimum value of all the diverging distances between all possible couples of codewords of C of unequal length:

$$d_{min} = \min\{D(c_i, c_j): c_i, c_j \in C, |c_i| \neq |c_j|\} \qquad (8)$$

(e) converging distance and minimum converging distance: the converging distance between two codewords of different length $$c_i = x_{i_1} x_{i_2} \ldots x_{i_{l_i}} \text{ and } c_j = x_{j_1} x_{j_2} \ldots x_{j_{l_j}}$$

of a VLEC code C, where $|c_i| = l_i > |c_j| = l_j$, is defined by:

$$C(c_i, c_j) = H\left(x_{i_{l_i - l_j + 1}} x_{i_{l_i - l_j + 2}} \ldots x_{i_{l_i}}, x_{j_1} x_{j_2} \ldots x_{j_{l_j}}\right) \qquad (9)$$

i.e. it is also the Hamming distance between a $l_j$-length codeword and the $l_j$-length suffix of a longer codeword, and the minimum converging distance of said VLEC code C is the minimum value of all the converging distances between all possible couples of C of unequal length:

$$c_{min} = \min\{C(c_i, c_j): c_i, c_j \in C, |c_i| \neq |c_j|\} \qquad (10)$$

(f) free distance: the free distance $d_{free}$ of a code is the minimum Hamming distance in the set of all arbitrary long paths that diverge from some common state $S_i$ and converge again in another common state $S_j$, with $j > i$:

$$d_{free} = \min\{H(f_i, f_j): f_i, f_j \in F_N, N = 1, 2, \ldots, \infty\} \qquad (11)$$

Following the structure model used for a VLC, it is therefore possible to describe the structure of the VLEC code C by the notation:

$$S_1 @ L_1, b_1; S_2 @ L_2, b_2; \ldots; S_R @ L_R, b_R; d_{min}, c_{min} \qquad (12)$$

where there are $s_i$ codewords of length $L_i$ with minimum block distance $b_i$, for all $i = 1, 2, \ldots R$, (it is recalled that R is the number of different codeword lengths) and minimum diverging and converging distances $d_{min}$ and $c_{min}$. The most important parameter of a VLEC code is its free distance $d_{free}$, which influences greatly its performance in terms of error-correcting capabilities, and it can be shown that the free distance of a VLEC code is bounded by:

$$d_{free} \geq \min(b_{min}, d_{min} + c_{min}) \qquad (13)$$

These definitions being recalled, the state-of-the-art in VLEC codes construction will be now described more easily. The first types of VLEC codes, called α-prompt codes and introduced in 1974, and an extension of this family, called $a_{t_1, t_2, \ldots, t_R}$-prompt codes, have both the same essential property: if one denotes by $\alpha(c_i)$ the set of words that are closer to $c_i$ than to any codeword $c_j$, with $j \neq i$, no sequence in $\alpha(c_i)$ is a prefix of a sequence in another $\alpha(c_j)$. The construction of these codes is very simple, and the construction algorithm is adjustable by the number of codewords at each length, which makes possible to find the best prompt code for a given source and a given $d_{free}$. However, this best code performs poorly in terms of compression performance.

A more recent construction, allowing the construction of a VLEC code from the generator matrix of a fixed-length linear block code, was proposed in the document "Variable-length error-correcting codes" by V. Buttigieg, Ph.D. Thesis, University of Manchester, England, 1995. Called code-anticode construction, this algorithm relies on line combinations and column permutations to form an anticode at the rightmost column. Once the code-anticode generator matrix is obtained, the VLEC code is simply obtained by a matrix multiplication.

This technique has however several drawbacks. First, there is no explicit method to find the needed line combinations and column permutations to obtain the anticode. Moreover, the construction does not take into account the source statistics and, consequently, often reveals itself sub-optimal (one can find a code with smaller average length by a post-processing on the VLEC code). In the same document, the author has then proposed an improved method, called Heuristic method, that is based on a computer search for building a VLEC code giving the better known compression rate for a specified source and a given protection against errors, i.e. a code C with specified overall minimum block, diverging and converging distances (and hence a minimum value for due) and with codeword lengths matched to the source statistics so as to obtain a minimum average codeword length for the chosen free distance and the specified source (in practice, one takes: $b_{min} = d_{min} + c_{min} = d_{free}$, and: $d_{min} = \lceil d_{free}/2 \rceil$).

The main steps of this Heuristic method, which uses the following parameters: minimum length $L_1$ of codewords, maximum length $L_{max}$ of codewords, free distance $d_{free}$ between each codeword, number S of codewords required, are now described with reference to the flowcharts of FIGS. 2 to 4.

To start the computer search ("Start"), all the needed parameters must be first specified: $L_1$ (the minimum codeword length, which must be at least equal to or greater than the minimum diverging distance required), $L_{max}$ (the maximum codeword length), the different distances between codewords ($d_{free}$, $b_{min}$, $d_{min}$, $c_{min}$), and S (the number of codewords required by the given source), and some relations are set when choosing these parameters:

$L_1 \leq d_{min}$
$b_{min} = d_{free}$
$d_{min} + c_{min} = d_{free}$

Figure 5:
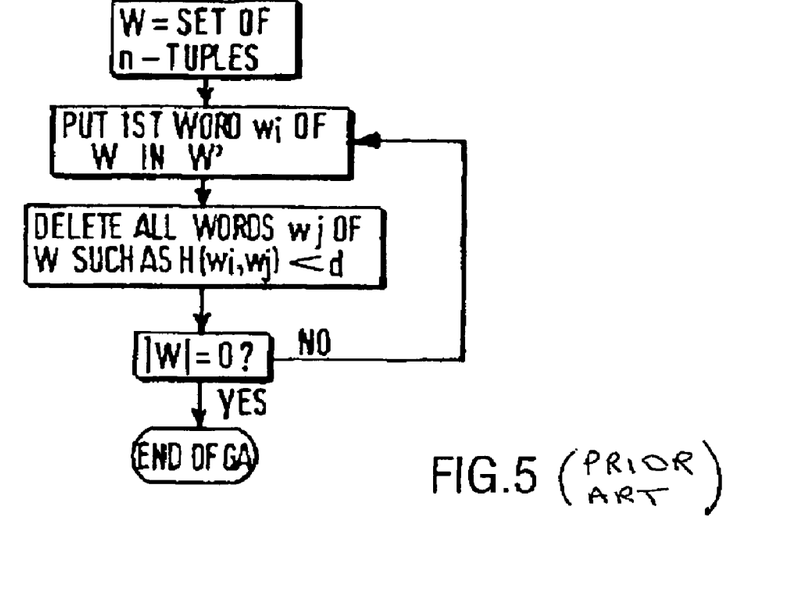
FIG. 5 illustrates an algorithm (called greedy algorithm, or GA) used for the initialization of the method of FIGS. 2 to 4.
Figure 6:
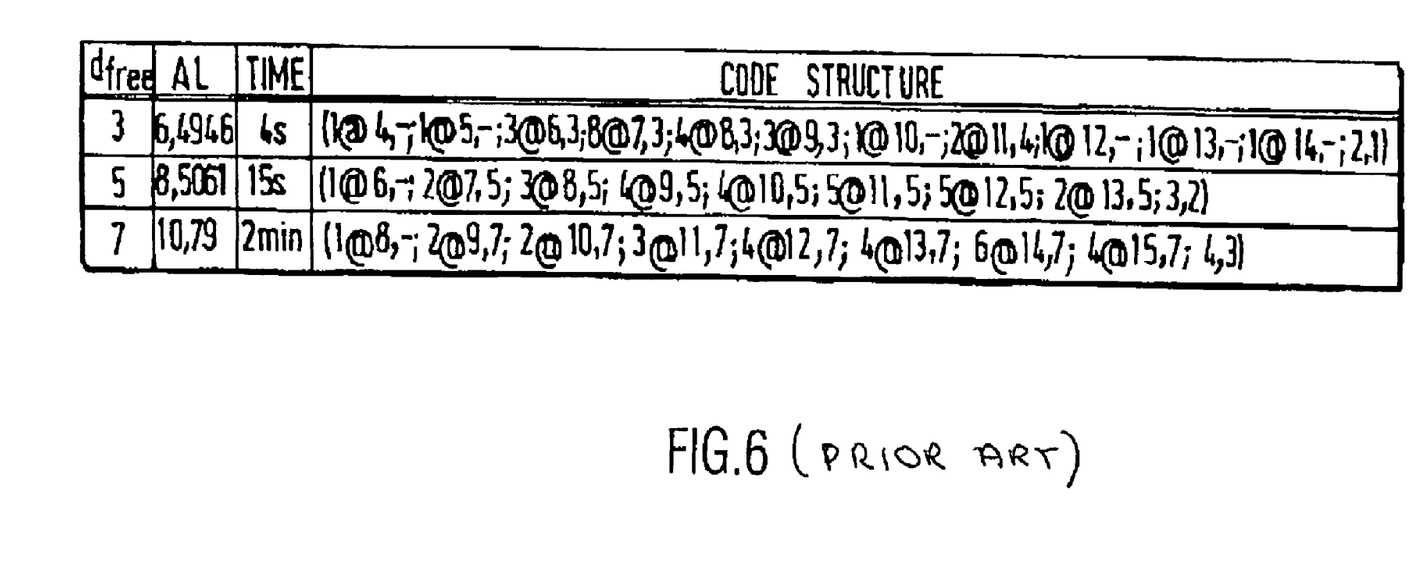
FIG. 6 is a table giving various VLEC codes for a source constructed with the Heuristic construction using said algorithm of FIG. 5.
Figure 7:
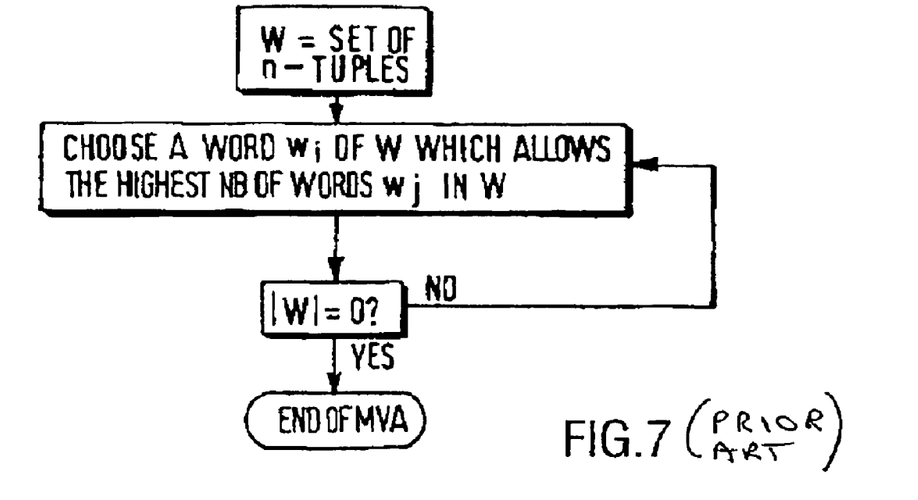
FIG. 7 illustrates another algorithm (called majority voting algorithm, or MVA) used for the initialization of the method of FIGS. 2 to 4.
Figure 8:
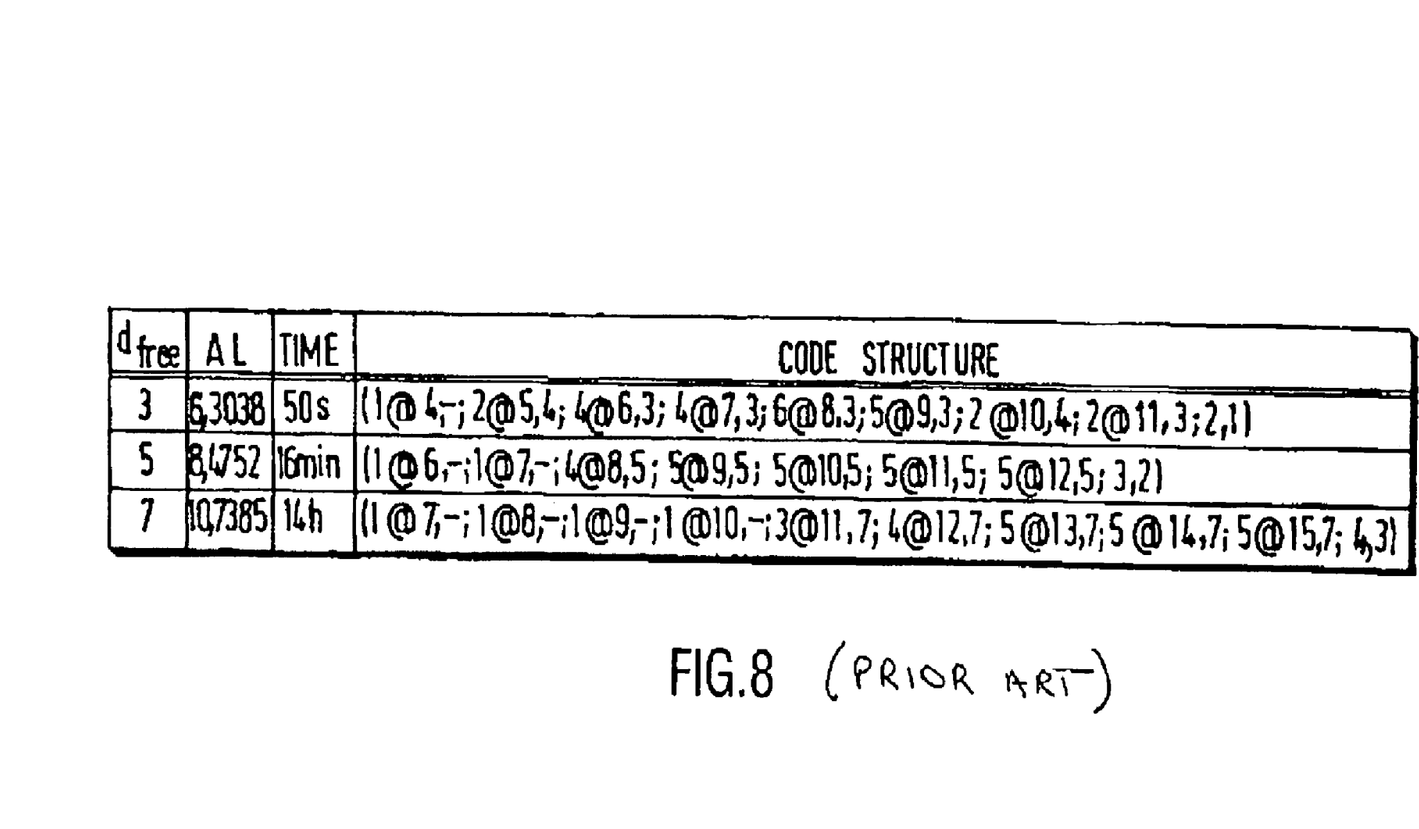
FIG. 8 is another table giving various VLEC codes for a source constructed with the Heuristic construction using said algorithm of FIG. 7.
Figure 9:
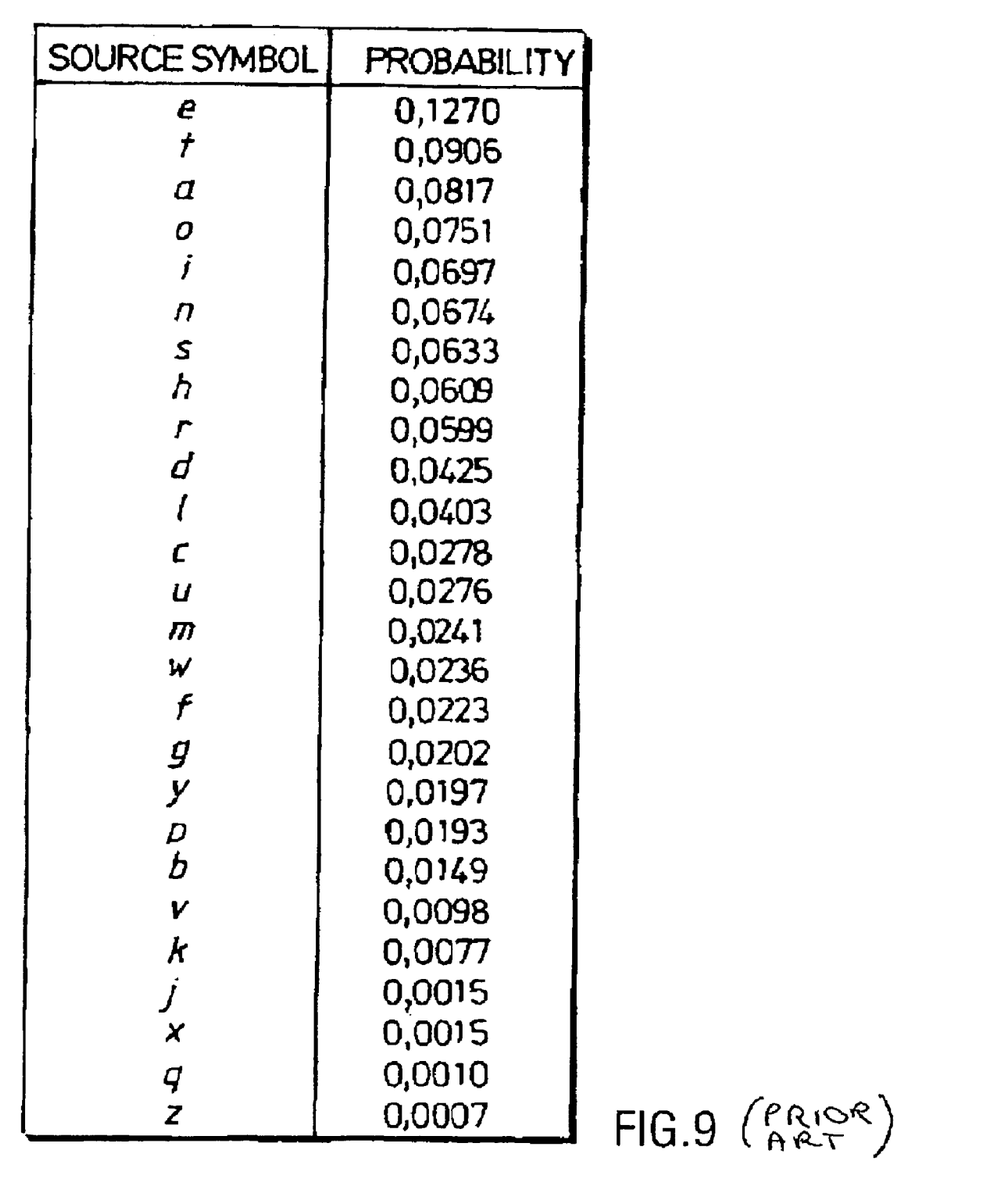
FIG. 9 is a table giving for the 26-symbol English source the correspondence between the source symbol and its probability.

The first phase of the algorithm, referenced 11, is then performed: it consists in the generation of a fixed length code (put initially in C) of length $L_1$ and minimal distance $b_{min}$, with a maximum number of codewords. This phase is in fact an initialization, performed for instance by means of an algorithm such as the greedy algorithm (GA), presented in FIG. 5, or the majority voting algorithm (MVA), presented in FIG. 7, or a new proposed variation, denoted by GAS (Greedy Algorithm by Step), which consists in a variation of the two above mentioned ones (the GAS consists in the search method used in the GA, where instead of deleting half of the codewords, only the last codeword of the group is deleted). These two algorithms are useful to create a set W of n-bit long words distant of d (in practice, it may be noted that the MVA finds more words than the GA, but it asks too much time for only a small improvement of the compression capacity, as shown in the tables of FIGS. 6 and 8, which compare, respectively for the GA and for the MVA, the best code structures obtained with different values of $d_{free}$ for the 26-symbol English source defined in the table of FIG. 9.

Figure 2:
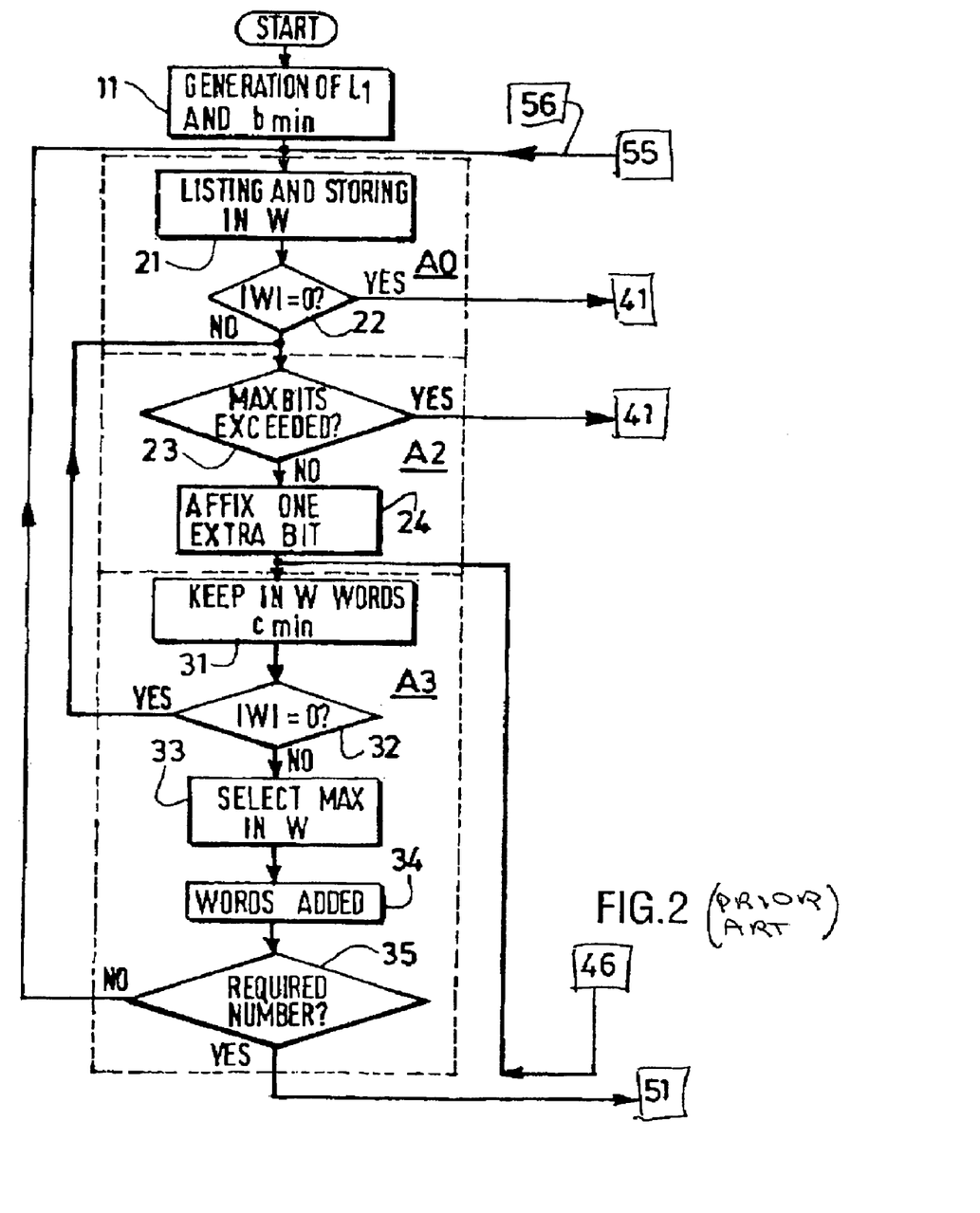
FIGS. 2 to 4 are the three parts of a single flowchart illustrating the main steps of a conventional method used for building a VLEC code, called Heuristic method.

The second phase of the algorithm, corresponding to the elements referenced 21 to 24 (21+22=operation "A0"; 23+24=operation "A2") in FIG. 2, consists in listing and storing (step 21) in a set called W all the possible $L_1$-tuples at the distance of $d_{min}$ from the codewords in C. If $d_{min} \geq b_{min}$, then W is empty. If this set W of all the words satisfying the minimum diverging distance to the current code is not empty (reply NO to the test 22: |W|=0 ?), the number of words in W is doubled by increasing the length of the words by one bit by affixing first a "0" and then a "1" to the rightmost position of all the words in W (step 24), except if the maximum number of bits is exceeded (reply YES to the test 23). At the output of said step 24, this modified set W has twice more words than the previous W, and the length of each one is $L_1+1$.

The third phase of the algorithm, corresponding to the elements 31 to 35 (=operation "A3" in FIG. 2), consists in deleting (step 31) all the words of set W that do not satisfy the $c_{min}$ distance (minimum converging distance) with all the codewords of C (i.e. in keeping and storing in a new W only the words which satisfy said minimum converging distance, the other ones being discarded). At this point, the new set W is a set of words which, when compared to the codewords of C, satisfy the required minimum diverging and converging distances (both $d_{min}$ and $c_{min}$ distances) with the codewords of C. If that new set W is not empty (reply NO to the test 32: |W|=0 ?) one selects in W (step 33) the maximum number of words to satisfy the minimum block distance, in order to ensure that all the words of the set W, being of the same length, have a minimum distance at least equal to $b_{min}$. At the end of this step 33, realized with the GA or the MVA (note that in this case, the initial set used for the GA or the MVA is the current W and not a n-tuples set), the words thus obtained are added (step 34) to the codewords already in C.

If no word is found (i.e. W is empty) at the end of the step 21 (reply YES to the test 22: |w|=0 ?) or if the maximum number of bits is reached or exceeded (reply YES to the test 23), one enters the fourth phase of the algorithm (steps 41 to 46, illustrated in FIG. 3 and also designated by the operation "A1" in said figure), which is used in order to unjam the process by inserting more liberty of choice, more particularly by affixing to all words in W extra bits (several bits at the same time) such that the new group contains more bits than the old one. If there are enough codewords in the last group (successive tests 41 and 42, for verifying the number of codewords in the last group, and if there are previous groups), some of them are deleted from this said group (as described above), such deletions allowing to reduce the distance constraint and to find more codewords than before. As a matter of fact, the classical Heuristic method thus described begins with the maximum of codewords with the short length, maps them with the high probability symbols and tries to obtain a good compression rate, but sometimes the size of the small lengths sets are incompatible with the required number of codewords S. In this optic, easing a few codewords provides more freedom degrees and allows to reach a position where the initial requirements on distance and number of symbols for the code can be met. This deletion process is repeated until it remains a maximum of one codeword for each length. If W is empty at the end of the step 31 (reply YES to the test 32: |W|=0 ?), the steps 23, 24, 31, 32 are repeated. If the required number of codewords has not been reached (reply NO to the test 35 provided at the end of this third phase), the steps 21 to 24 and 31 to 35 must be repeated until said steps find that either there are no further possible words to be found or the required number of codewords is reached.

If said required number of codewords has been reached (i.e. the number of codewords of C is equal to or greater than S (reply YES to the test 35), the structure of the VLEC code thus obtained is used in a fifth part, including the steps 51 to 56 (illustrated in FIG. 4, and also designated by the operation "A4" in said figure), in order to calculate the average length AL. This is done by weighting each codeword length with the probability of the source, and comparing it to the current best one. If said average length AL of this VLEC code is lower than the minimized value of AL (=$AL_{min}$), this AL becomes the $AL_{min}$, and this new AL value and the corresponding code structure are kept in the memory (step 51). These steps 51 and following (fifth part; operation "A4") allow to come back, within the algorithm, towards previous groups, while the other phases of said algorithm are always performed on the current group. The stepsize for such a feedback operation is one, i.e. this feedback action can be considered as exhaustive.

To continue this search of the best VLEC code, it is necessary to avoid keeping the same structure, which would lead to a loop in the algorithm. The last added group of the current code is deleted (steps 52, 53), the deletion of shorter length codewords allowing to find more longer length codewords (test 54: number of codewords in group greater than 1 ?), and some codewords (half the amount for the GVA; the "best" one for the MVA) of the previous group are deleted (step 55), in order to re-loop (step 56) the algorithm at the beginning of the step 21 (see FIG. 2) and find different VLEC structures (the number of deleted codewords depends on which method is used for selecting the words: if the GA method is used and one wants to obtain a linear code, it is necessary to delete half of the codewords, while with the MVA method only one codeword, the best one, is deleted, i.e. the one that allows to find the more codewords in the next group).

However, the Heuristic method thus described often considers very unlikely code structures or proceeds with such a care (in order not to miss anything) that a great complexity is observed in the implementation of said method, which moreover is rather time consuming and can thus become prohibitive.

SUMMARY OF THE INVENTION

It is therefore an object of the invention to propose an improved construction method with which it is possible to gain in complexity by avoiding these drawbacks.

To this end, the invention relates to a method of building a variable length error code as defined in the introductory paragraph of the description, said building method being moreover such that at most one bit is added at the end of each word of the set W.

It is also an object of the invention to propose a device for carrying out such a variable length error code building method.

BRIEF DESCRIPTION OF THE DRAWINGS

The present invention will now be described, by way of example, with reference to the accompanying drawings in which.

DETAILED DESCRIPTION OF THE INVENTION

Simulations show that, with the classical Heuristic method, almost none of the obtained best codes has a hole, i.e. a length jump in its structure length. It is therefore proposed, according to the invention, to consider that most good codes do not have jump of length and therefore to reduce accordingly the set of examined VLEC codes (which consequently reduces the simulation time and the complexity of implementation of the method, without modifying much the AL). Following this hypothesis, the method is, according to the invention, modified by avoiding to add more than one bit at the end of each word of the set W.

Figure 3:
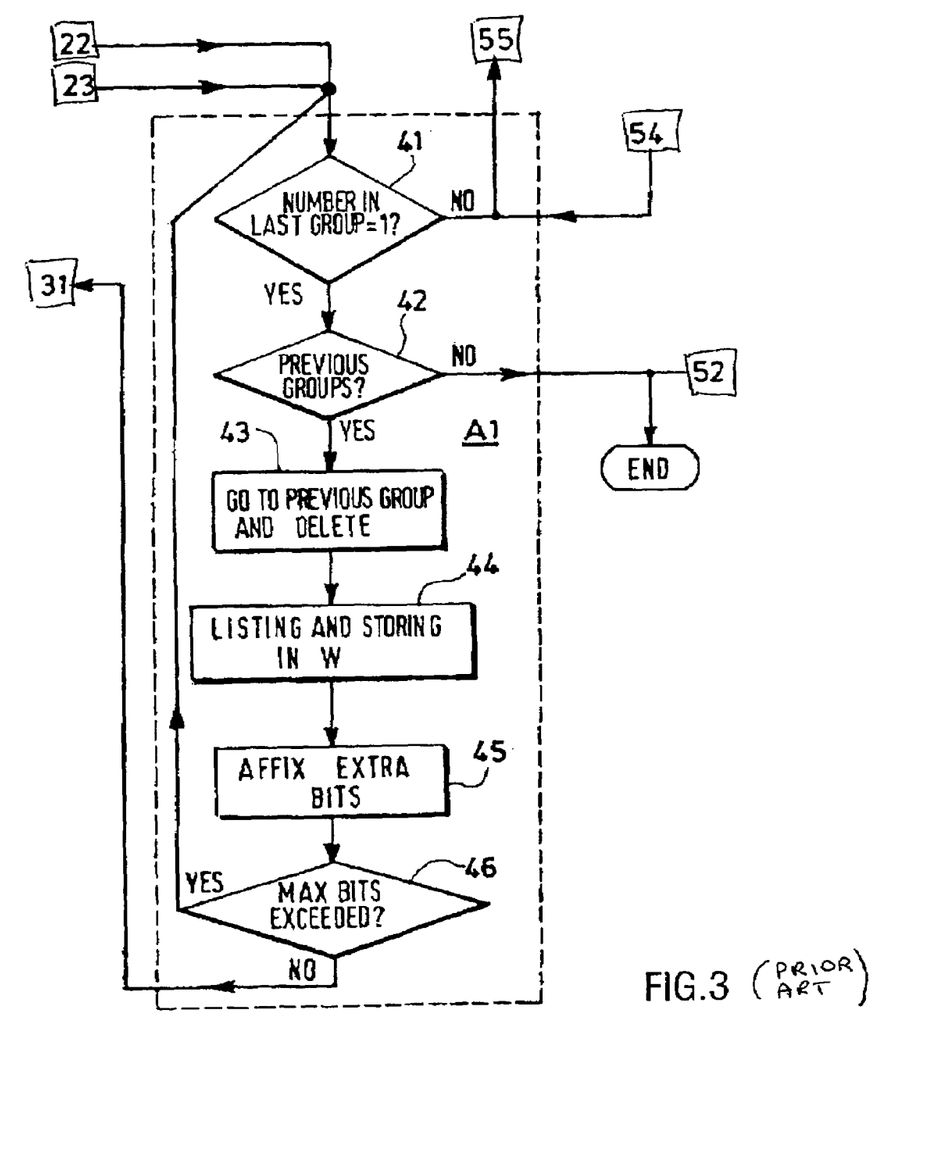
Figure 4:
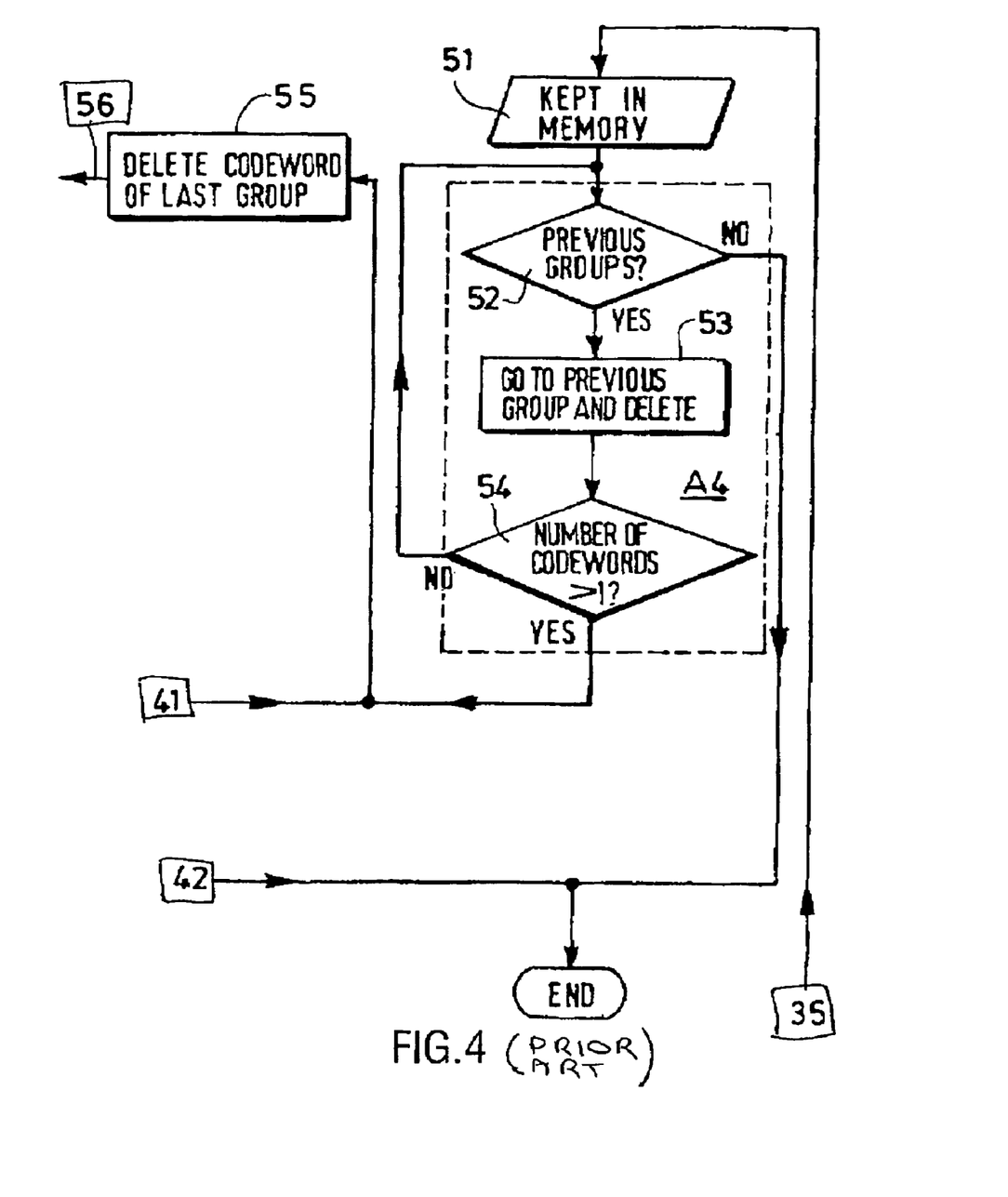
Figure 10:
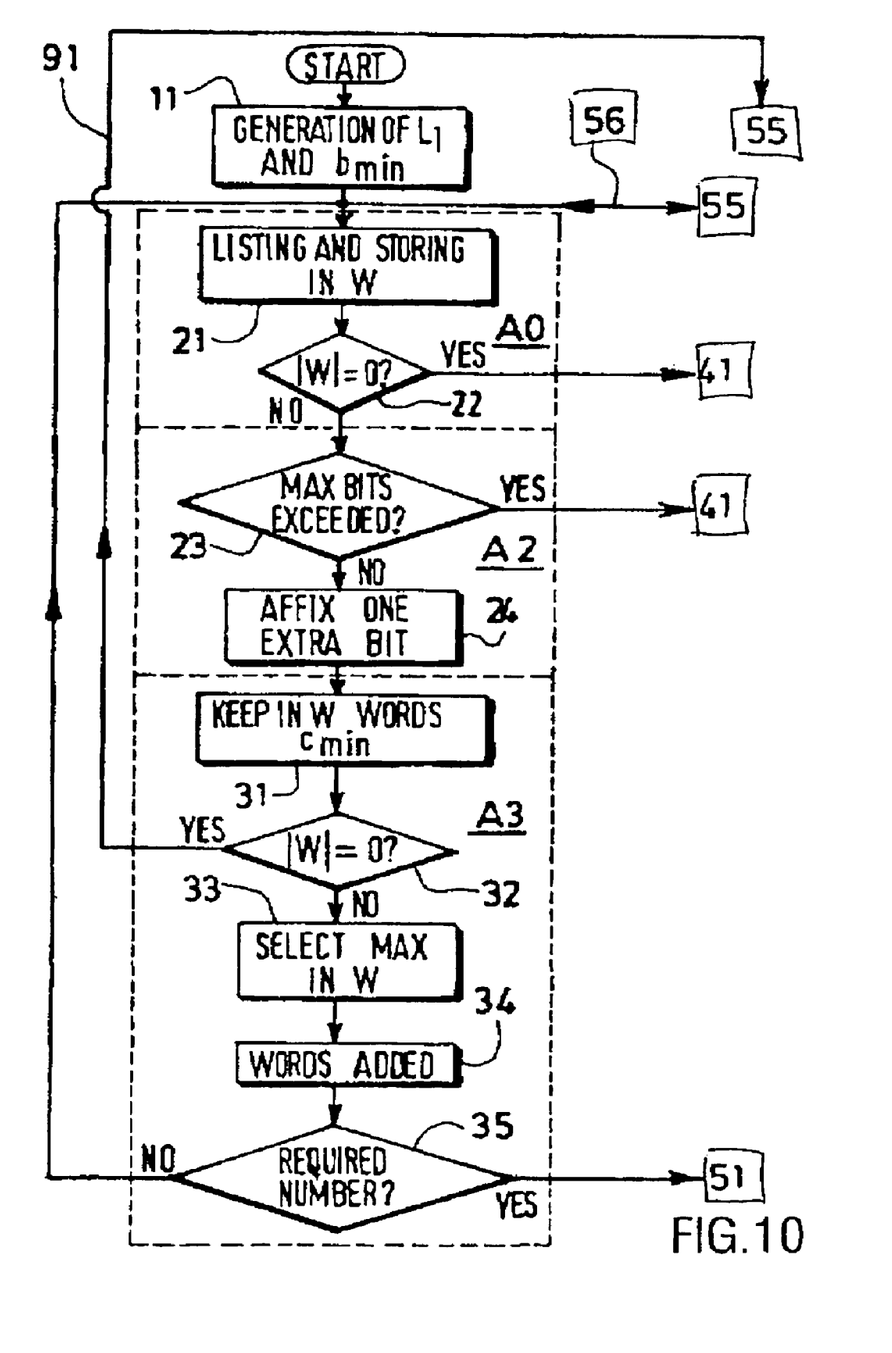
FIGS. 10 and 11 are the two parts of a single flowchart according to the invention, illustrating an implementation of an improvement of the conventional method illustrated in FIGS. 2 to 4.
Figure 11:
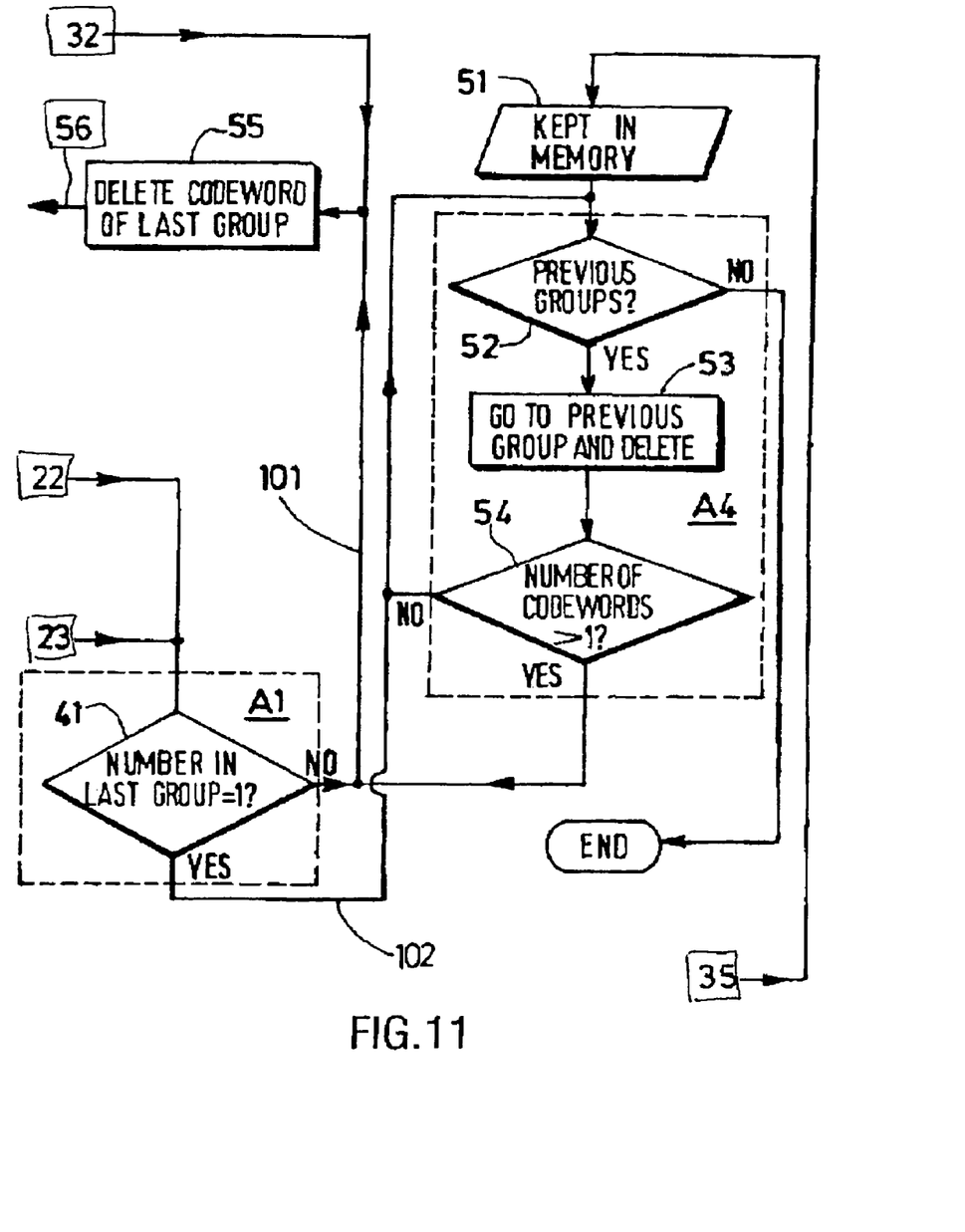

The corresponding implementation (improved Heuristic construction method, with no hole optimization) is illustrated in FIGS. 10 and 11, which show the two parts of a flowchart corresponding to a system allowing to carry out the improved method according to the invention (the elements that are identical to the ones observed in FIGS. 2 to 4 being designated with the same references).

The main differences with the flowchart of FIGS. 2 to 4 are the following ones:
  (a) first, parts that, with respect to the classical Heuristic technique, are useless for the implementation of the improved method are cancelled:
  (b) if W is empty at the end of the step 31 (reply YES to the test 32: |W|=0 ?), the next phase is now (see FIG. 10) not the repetition of the steps (23, 24, 31, 32), but the establishment (in place of said repetition) of a direct connection 91 towards the input (in FIG. 11) of the circuit carrying out the operation 55 (deletion of some codewords, or of the best one, before a repetition of the steps 21 to 24 and 31 to 35), said operation 55 being therefore, as previously, followed by the operations 21 and following.
  (c) the fourth phase of the method is now reduced to one step, the operation 41 (FIG. 11), which is the test "Number of codewords in last group=1 ?". If the reply is NO, a direct link 101 is established with the input of the step 55 in view of carrying out said operation 55, and then the operations 21 and following. If the reply is YES, a connection 102 is established with the input of the set of operations 52 to 54.

Figures 12, 13:
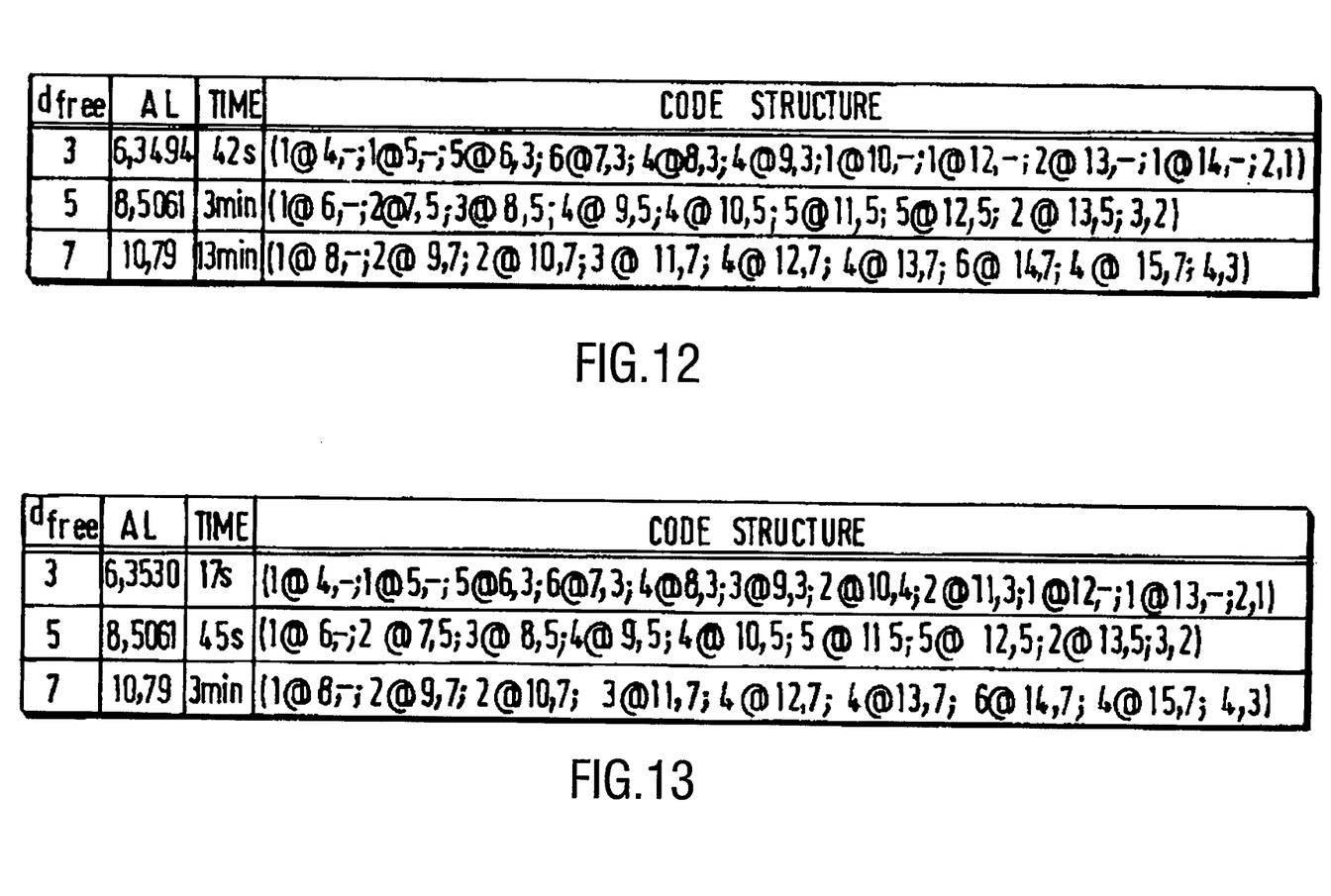
FIG. 12 is another table giving various VLEC codes for the same 26 symbol English source as considered in the tables of FIGS. 6 and 8 and using the GAS.
FIG. 13 is another table giving various VLEC codes for the same source as in FIG. 12 and using both the GAS previously mentioned and the building method according to the invention.

The results obtained with the present solution (called "noHole optimization method") are presented in the table of FIG. 12 for the 26 symbol English source when using the GAS method for selecting codewords. It can be seen, when comparing with results presented in FIG. 13, that although the result is not completely optimal for $d_{free}=3$ (the code structure has a hole at length L=11), the AL rise is really acceptable when one considers that there is both strictly no degradation for the other $d_{free}$ values and a gain of time between 2,5 and 4. The same remarks can be applied when comparing the present solution with the ones obtained in FIG. 7, where the MVA complexity effect is clear. Similarly, applying the noHole optimization with the GA method for selecting codewords leads to a time gain at the only expense of a slight AL rise for $d_{free}=3$. Finally, FIG. 5 shows on the other hand that the current solution offers better AL for an acceptable gain of time, the noHole optimization compensating almost entirely the complexity induced by the GAS.

The invention claimed is:

1. "A method of transmitting signals comprising the steps of:
  receiving signals to be transmitted;
  source encoding said signals to build a variable length error code;
  channel encoding the variable length error code; and
  transmitting the channel encoded variable length error code, wherein said step of source encoding said signals to build the variable length error code, comprises the sub-steps of:"
(1) initializing the needed parameters: minimum and maximum length of codewords L1 and Lmax respectively, free distance $d_{free}$ between each codeword (said distance $d_{free}$ being for a VLEC code C the minimum Hamming distance in the set of all arbitrary extended codes), required number of codewords S;
(2) generating a fixed length code C of length L1 and minimal distance $b_{min}$, with $b_{min}$=min (bk; k=1, 2, ..., R), bk=the distance associated to the codeword length Lk of code C and defined as the minimum Hamming distance between all codewords of C with length Lk, and R=the number of different codeword lengths in C, said generating step 11 creating a set W of n-bit long words distant of d;
(3) listing and storing in the set W all the possible $L_1$-tuples at the distance of dmin from the codewords of C (said distance dmin for a VLEC code C being the minimum value of all the diverging distances between all possible couples of different-length codewords of C, and, in the case where no word is found or the maximum number of bits is reached, reducing a constraint of distance for finding more words and deleting one or more codewords of a last group, otherwise doubling the number of words in W by affixing at the end of all words one extra bit, said storing step therefore replacing the set W by a new one having twice more words than the previous one and the length of each one of these words being L1 +1;
(4) deleting all the words of the set W that do not satisfy the cmin distance With all codewords of C, said distance $c_{min}$ being the minimum converging distance of the code C;
(5) in the case where no word is found following acts 3 and 4, deleting codewords of the last group, otherwise controlling that all words of the set W are distant of bmin, the found words being then added to the code C;
(6) if the required number of codewords has not been reached, repeating the acts (1) to (5) until the method finds either no further possibility to continue or the required number of codewords has been reached;
(7) if the number of codewords of C is greater than S calculating, on the basis of the structure of the VLEC code, the average length AL obtained by weighting each codeword length with the probability of the source, said AL becoming the ALmin, if it is lower than ALmin, with ALmin=the minimum value of AL, and the corresponding code structure being kept in memory; said building method being moreover such that at most one bit is added at the end of each word of the set W.

2. A computer program stored on a computer readable medium to cause a computer configured, to build a variable length error code (VLEC), the computer comprising:

(1) a portion configured to initialize needed parameters: minimum and maximum length of codewords $L_1$ and $L_{max}$ respectively, free distance $d_{free}$ between each codeword, said distance $d_{free}$ being for a VLEC code C the minimum Hamming distance in the set of all arbitrary extended codes, and a required number of codewords S;
(2) a portion configured to generate a fixed length code C of length $L_1$ and minimal distance $b_{min}$, with $b_{min}$=min $\{b_k; k=1, 2, \ldots, R\}$, $b_k$=the distance associated to the codeword length $L_k$ of code C and defined as the minimum Hamming distance between all codewords of C with length $L_k$, and R=the number of different codeword lengths in C, said generating creating a set W of n-bit long words distant of d;
(3) a portion configured to list and store in the set W all possible $L_1$-tuples at the distance of $d_{min}$ from the codewords of C, said distance $d_{min}$ for a VLEC code C being the minimum value of all diverging distances between all possible couples of different-length codewords of C, and, in the case where no word is found or the maximum number of bits is reached, a portion configured to reduce a constraint of distance for finding more words and delete one or more codewords of a last group, otherwise a portion configured to double the number of words in W by affixing at the end of all words one extra bit, said portion configured to store therefore replacing the set W by a new one having twice more words than the previous one and the length of each one of these words being $L_1$+1;
(4) a portion configured to delete all the words of the set W that do not satisfy the $c_{min}$ distance with all codewords of C, said distance $c_{min}$ being the minimum converging distance of the code C;
(5) in the case where no word is found following acts 3 and 4, a portion configured to delete codewords of the last group, otherwise control that all words of the set W are distant of $b_{min}$, with found words being then added to the code C;
(6) if the required number of codewords has not been reached, a portion configured to repeat (1) to (5) until the computer finds either no further possibility to continue or the required number of codewords has been reached;
(7) if the number of codewords of C is greater than S, a portion configured to calculate, on the basis of the structure of the VLEC code, the average length AL obtained by weighting each codeword length with a probability of the source, said AL becoming the $AL_{min}$, if it is lower than $AL_{min}$, with $AL_{min}$=the minimum value of AL, and the corresponding code structure being kept in memory.

* * * * *